(12) United States Patent
Adams et al.

(10) Patent No.: US 7,135,392 B1
(45) Date of Patent: Nov. 14, 2006

(54) THERMAL FLUX LASER ANNEALING FOR ION IMPLANTATION OF SEMICONDUCTOR P-N JUNCTIONS

(75) Inventors: Bruce E. Adams, Portland, OR (US);
Dean Jennings, Beverly, MA (US);
Abhilash J. Mayur, Salinas, CA (US);
Vijay Parihar, Fremont, CA (US);
Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/185,651

(22) Filed: Jul. 20, 2005

(51) Int. Cl.
*H01L 21/42* (2006.01)

(52) U.S. Cl. ............... 438/513; 438/530; 257/E21.337

(58) Field of Classification Search ............... 438/513, 438/530; 257/E21.337
See application file for complete search history.

(56) References Cited

U.S. PATENT DOCUMENTS

| | | | | |
|---|---|---|---|---|
| 3,778,791 | A | 12/1973 | Lewicki et al. .......... 179/100.2 |
| 4,305,640 | A | 12/1981 | Cullis et al. ................ 350/96.1 |
| 4,647,774 | A | 3/1987 | Brisk et al. .................. 250/338 |
| 4,730,113 | A | 3/1988 | Edwards ...................... 250/347 |
| 5,463,202 | A | 10/1995 | Kurosawa et al. ..... 219/121.83 |
| 5,861,992 | A | 1/1999 | Gelbart ........................ 359/619 |
| 6,240,116 | B1 | 5/2001 | Lang et al. .................... 372/50 |
| 6,494,371 | B1 | 12/2002 | Rekow et al. ............... 235/454 |
| 6,530,687 | B1 | 3/2003 | Suzuki et al. ................ 374/131 |
| 6,531,681 | B1 | 3/2003 | Markle et al. ......... 219/121.69 |
| 6,747,245 | B1 | 6/2004 | Talwar et al. ............ 219/121.8 |
| 6,771,686 | B1 | 8/2004 | Ullman et al. ................ 372/92 |
| 6,780,692 | B1 | 8/2004 | Tatsuiki et al. .............. 438/166 |
| 6,809,012 | B1 | 10/2004 | Yamazaki et al. .......... 438/473 |
| 6,895,164 | B1 | 5/2005 | Saccomanno ............... 385/146 |
| 6,987,240 | B1 | 1/2006 | Jennings et al. .......... 219/121.8 |
| 7,005,601 | B1 | 2/2006 | Jennings ................. 219/121.66 |
| 2003/0196996 | A1* | 10/2003 | Jennings et al. ........ 219/121.73 |
| 2004/0095983 | A1 | 5/2004 | Whitley ....................... 372/108 |
| 2004/0149217 | A1 | 8/2004 | Collins et al. .............. 118/723 |
| 2004/0179807 | A1 | 9/2004 | Tanaka ........................ 385/146 |
| 2004/0188399 | A1 | 9/2004 | Smart ..................... 219/121.69 |
| 2004/0198028 | A1 | 10/2004 | Tanaka et al. ............... 438/487 |
| 2004/0263986 | A1 | 12/2004 | Brown ......................... 359/626 |
| 2005/0175285 | A1 | 8/2005 | Reynolds et al. ............. 385/39 |
| 2005/0181550 | A1* | 8/2005 | Tanaka ........................ 438/150 |
| 2006/0008237 | A1 | 1/2006 | Imade ......................... 385/146 |

FOREIGN PATENT DOCUMENTS

DE 10339237 3/2004

(Continued)

*Primary Examiner*—Richard A. Booth
(74) *Attorney, Agent, or Firm*—Law Office of Robert M. Wallace

(57) ABSTRACT

A method for forming P-N junctions in a semiconductor wafer includes ion implanting dopant impurities into the wafer and annealing the wafer using a thermal flux laser annealing apparatus that includes an array of semiconductor laser emitters arranged in plural parallel rows extending along a slow axis, plural respective cylindrical lenses overlying respective ones of the rows of laser emitters for collimating light from the respective rows along a fast axis generally perpendicular to the slow axis, a homogenizing light pipe having an input face at a first end for receiving light from the plural cylindrical lenses and an output face at an opposite end, the light pipe comprising a pair of reflective walls extending between the input and output faces and separated from one another along the direction of the slow axis, and scanning apparatus for scanning light emitted from the homogenizing light pipe across the wafer in a scanning direction parallel to the fast axis.

10 Claims, 5 Drawing Sheets

FOREIGN PATENT DOCUMENTS

| | | |
|---|---|---|
| EP | 0 231 794 A2 | 8/1987 |
| EP | 231 794 A2 | 8/1987 |
| JP | 57099747 | 6/1982 |
| JP | 2001-91231 A | 3/2000 |
| WO | WO 03/089184 | 10/2003 |
| WO | WO 03/089184 A1 | 10/2003 |
| WO | WO 2004/044955 | 7/2004 |

* cited by examiner

THERMAL FLUX LASER ANNEALING FOR ION IMPLANTATION OF SEMICONDUCTOR P-N JUNCTIONS

This application contains subject matter related to U.S. application Ser. No. 11/185,454 filed Jul. 20, 2005 entitled RAPID DETECTION OF IMMINENT FAILURE IN LASER THERMAL PROCESSING OF A SUBSTRATE by Bruce Adams, et al.; U.S. application Ser. No. 11/185,649 filed Jul. 20, 2005 entitled SINGLE AXIS LIGHT PIPE FOR HOMOGENIZING SLOW AXIS OF ILLUMINATION SYSTEMS BASED ON LASER DIODES by Bruce Adams, et al.; U.S. application Ser. No. 11/195,380 filed Aug. 2, 2005 entitled MULTIPLE BAND PASS FILTERING FOR PYROMETRY IN LASER BASED ANNEALING SYSTEMS by Bruce Adams, et al.; and U.S. application Ser. No. 11/198,660 filed Aug. 5, 2005 entitled AUTOFOCUS FOR HIGH POWER LASER DIODE BASED ANNEALING SYSTEM by Dean Jennings, et al., all of which applications are assigned to the present assignee.

BACKGROUND OF THE INVENTION

1. Field of the Invention

The invention relates generally to thermal processing of semiconductor substrates. In particular, the invention relates to laser thermal processing of semiconductor substrates.

2. Background Art

Thermal processing is required in the fabrication of silicon and other semiconductor integrated circuits formed in silicon wafers or other substrates such as glass panels for displays. The required temperatures may range from relatively low temperatures of less than 250° C. to greater than 1000°, 1200°, or even 1400° C. and may be used for a variety of processes such as dopant implant annealing, crystallization, oxidation, nitridation, silicidation, and chemical vapor deposition as well as others.

For the very shallow circuit features required for advanced integrated circuits, it is greatly desired to reduce the total thermal budget in achieving the required thermal processing. The thermal budget may be considered as the total time at high temperatures necessary to achieve the desired processing temperature. The time that the wafer needs to stay at the highest temperature can be very short.

Rapid thermal processing (RTP) uses radiant lamps which can be very quickly turned on and off to heat only the wafer and not the rest of the chamber. Pulsed laser annealing using very short (about 20 ns) laser pulses is effective at heating only the surface layer and not the underlying wafer, thus allowing very short ramp up and ramp down rates.

A more recently developed approach in various forms, sometimes called thermal flux laser annealing or dynamic surface annealing (DSA), is described by Jennings et al. in PCT/2003/00196966 based upon U.S. patent application Ser. No. 10/325,497, filed Dec. 18, 2002 and incorporated herein by reference in its entirety. Markle describes a different form in U.S. Pat. No. 6,531,681 and Talwar yet a further version in U.S. Pat. No. 6,747,245.

The Jennings and Markle versions use CW diode lasers to produce very intense beams of light that strike the wafer as a thin long line of radiation. The line is then scanned over the surface of the wafer in a direction perpendicular to the long dimension of the line beam.

SUMMARY OF THE INVENTION

A method for forming P—N junctions in a semiconductor wafer includes ion implanting dopant impurities into the wafer and annealing the wafer using a thermal flux laser annealing apparatus that includes an array of semiconductor laser emitters arranged in plural parallel rows extending along a slow axis, plural respective cylindrical lenses overlying respective ones of the rows of laser emitters for collimating light from the respective rows along a fast axis generally perpendicular to the slow axis, a homogenizing light pipe having an input face at a first end for receiving light from the plural cylindrical lenses and an output face at an opposite end, the light pipe comprising a pair of reflective walls extending between the input and output faces and separated from one another along the direction of the slow axis, and scanning apparatus for scanning light emitted from the homogenizing light pipe across the wafer in a scanning direction parallel to the fast axis. Lenses focus light derived from the output face of the light pipe into a line of light on the wafer, the line of light having an elongate dimension along the slow axis and a narrow dimension along the fast axis, wherein the scanning apparatus scans the line of light across the wafer along the fast axis. The reflective walls of the light pipe are sufficiently close to one another to facilitate multiple reflections across the slow axis.

DETAILED DESCRIPTION OF THE INVENTION

Figure 1:
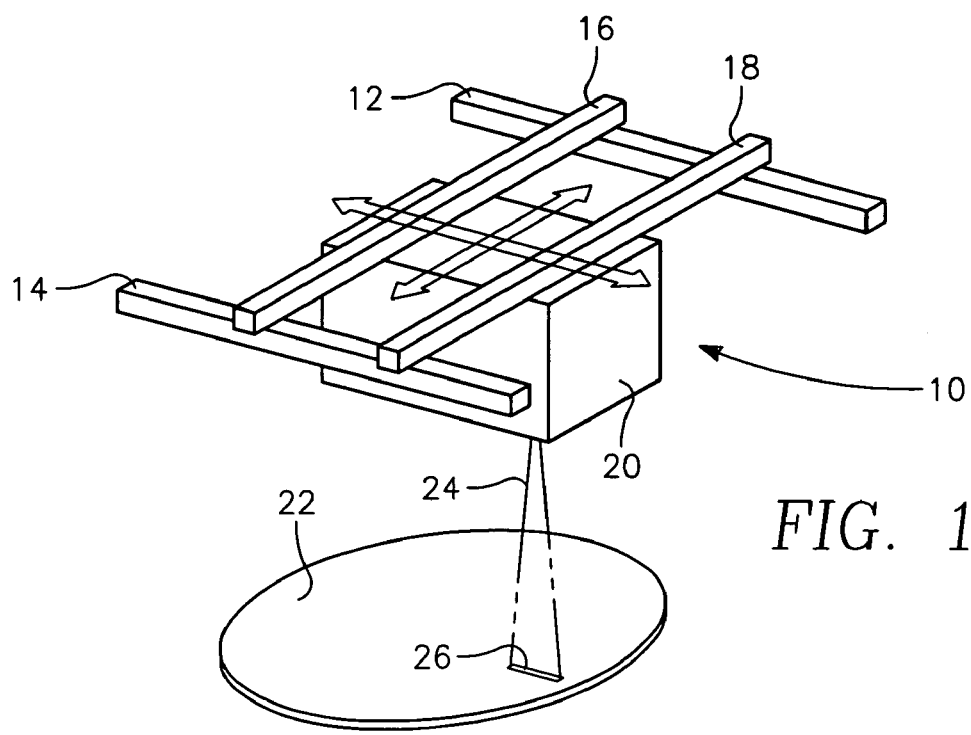
FIG. 1 is an orthographic representation of a thermal flux laser annealing apparatus employed in the present invention.

One embodiment of the apparatus described in the above-referenced application by Jennings et al. is illustrated in the schematic orthographic representation of FIG. 1. A gantry structure 10 for two-dimensional scanning includes a pair of fixed parallel rails 12, 14. Two parallel gantry beams 16, 18 are fixed together a set distance apart and supported on the fixed rails 12, 14 and are controlled by an unillustrated motor and drive mechanism to slide on rollers or ball bearings together along the fixed rails 12, 14. A beam source 20 is slidably supported on the gantry beams 16, 18, and may be suspended below the beams 16, 18 which are controlled by unillustrated motors and drive mechanisms to slide along them. A silicon wafer 22 or other substrate is stationarily supported below the gantry structure 10. The beam source 20 includes a laser light source and optics to produce a downwardly directed fan-shaped beam 24 that strikes the wafer 22 as a line beam 26 extending generally parallel to the fixed rails 12, 14, in what is conveniently called the slow direction. Although not illustrated here, the gantry structure further includes a Z-axis stage for moving the laser light source and optics in a direction generally parallel to the fan-shaped beam 24 to thereby controllably vary the distance between the beam source 20 and the wafer 22 and thus control the focusing of the line beam 26 on the wafer 22. Exemplary dimensions of the line beam 26 include a length of 1 cm and a width of 66 microns with an exemplary power density of 220 kW/cm$^2$. Alternatively, the beam source and associated optics may be stationary while the wafer is supported on a stage which scans it in two dimensions.

In typical operation, the gantry beams 16, 18 are set at a particular position along the fixed rails 12, 14 and the beam source 20 is moved at a uniform speed along the gantry beams 16, 18 to scan the line beam 26 perpendicularly to its long dimension in a direction conveniently called the fast direction. The line beam 26 is thereby scanned from one side of the wafer 22 to the other to irradiate a 1 cm swath of the wafer 22. The line beam 26 is narrow enough and the scanning speed in the fast direction fast enough that a particular area of the wafer is only momentarily exposed to the optical radiation of the line beam 26 but the intensity at the peak of the line beam is enough to heat the surface region to very high temperatures. However, the deeper portions of the wafer 22 are not significantly heated and further act as a heat sink to quickly cool the surface region. Once the fast scan has been completed, the gantry beams 16, 18 are moved along the fixed rails 12, 14 to a new position such that the line beam 26 is moved along its long dimension extending along the slow axis. The fast scanning is then performed to irradiate a neighboring swath of the wafer 22. The alternating fast and slow scanning are repeated, perhaps in a serpentine path of the beam source 20, until the entire wafer 22 has been thermally processed.

The optics beam source 20 includes an array of lasers. An example is orthographically illustrated in FIGS. 2 and 3, in which laser radiation at about 810 nm is produced in an optical system 30 from two laser bar stacks 32, one of which is illustrated in end plan view in FIG. 4. Each laser bar stack 32 includes 14 parallel bars 34, generally corresponding to a vertical p-n junction in a GaAs semiconductor structure, extending laterally about 1 cm and separated by about 0.9 mm. Typically, water cooling layers are disposed between the bars 34. In each bar 34 are formed 49 emitters 36, each constituting a separate GaAs laser emitting respective beams having different divergence angles in orthogonal directions. The illustrated bars 34 are positioned with their long dimension extending over multiple emitters 36 and aligned along the slow axis and their short dimension corresponding to the less than 1-micron p-n depletion layer aligned along the fast axis. The small source size along the fast axis allows effective collimation along the fast axis. The divergence angle is large along the fast axis and relatively small along the slow axis.

Returning to FIGS. 2 and 3 two arrays of cylindrical lenslets 40 are positioned along the laser bars 34 to collimate the laser light in a narrow beam along the fast axis. They may be bonded with adhesive on the laser stacks 32 and aligned with the bars 34 to extend over the emitting areas 36.

Figure 2:
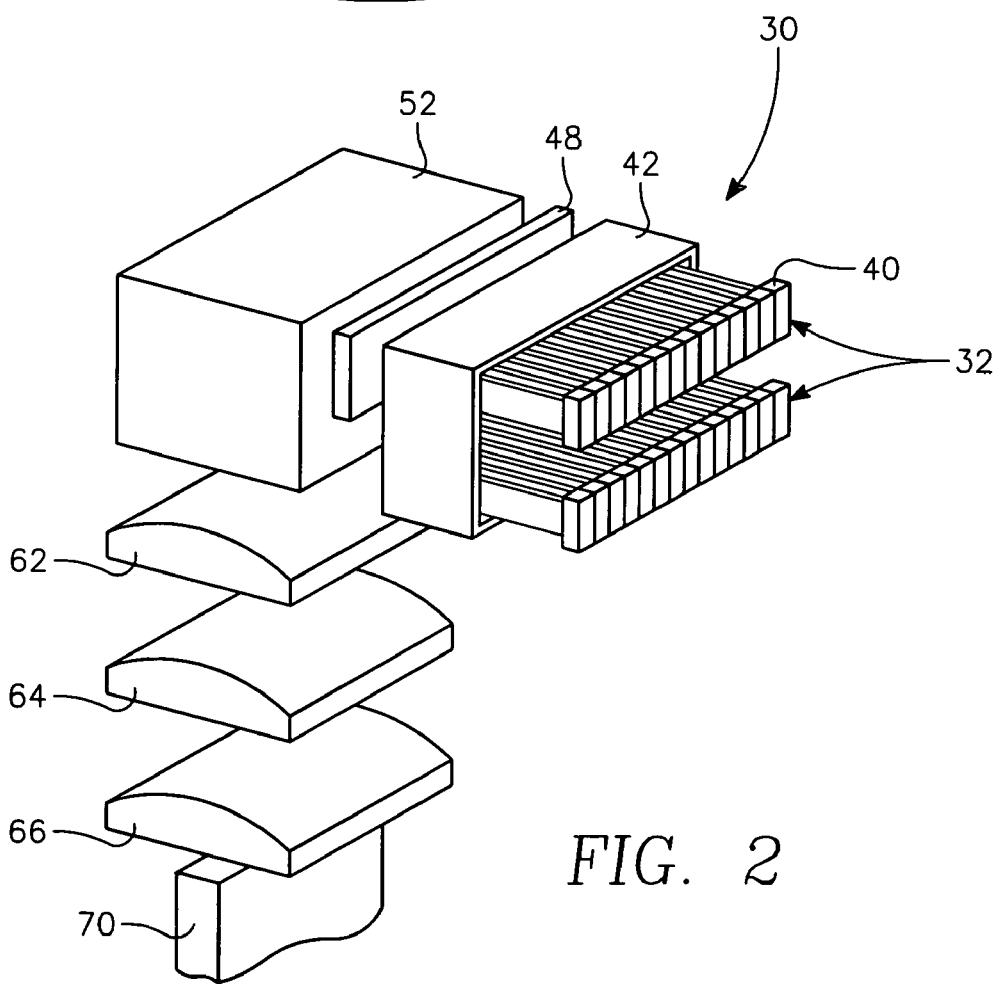
FIGS. 2 and 3 are orthographic views from different perspectives of optical components of the apparatus of FIG. 1.
Figure 3:
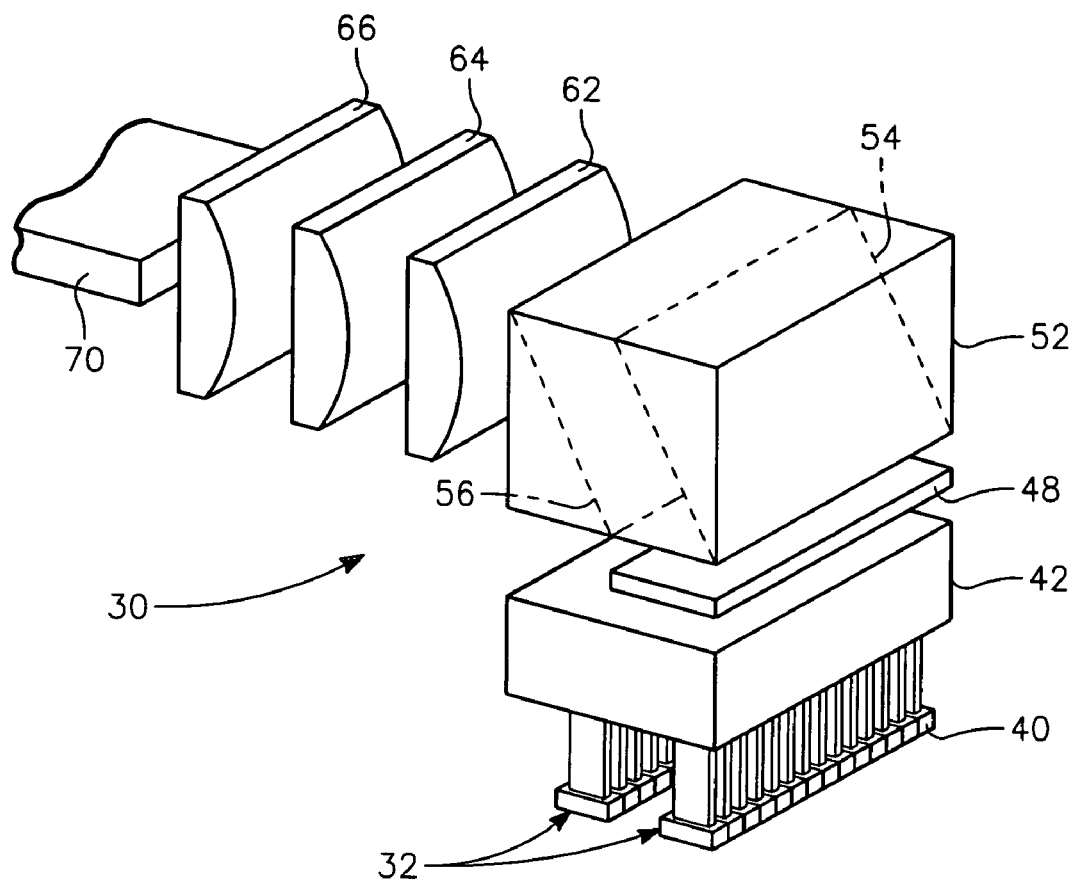
Figure 4:
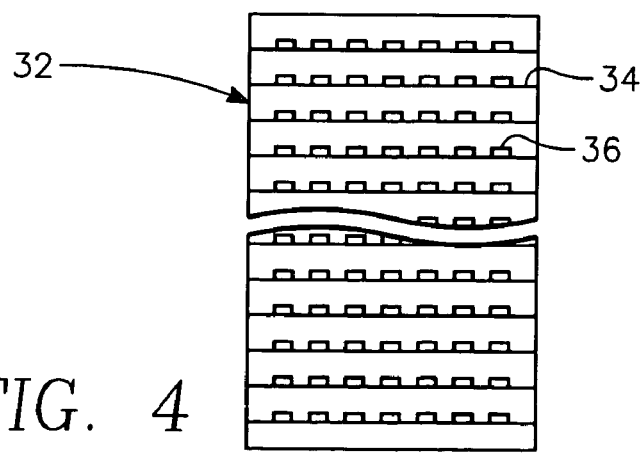
FIG. 4 is an end plan view of a portion of a semiconductor laser array in the apparatus of FIG. 1.

The optics beam source 20 can further include conventional optical elements. Such conventional optical elements can include an interleaver and a polarization multiplexer, although the selection by the skilled worker of such elements is not limited to such an example. In the example of FIGS. 2 and 3, the two sets of beams from the two bar stacks 32 are input to an interleaver 42, which has a multiple beam splitter type of structure and having specified coatings on two internal diagonal faces, e.g., reflective parallel bands, to selectively reflect and transmit light. Such interleavers are commercially available from Research Electro Optics (REO). In the interleaver 42, patterned metallic reflector bands are formed in angled surfaces for each set of beams from the two bar stacks 32 such that beams from bars 34 on one side of the stack 32 are alternatively reflected or transmitted and thereby interleaved with beams from bars 34 on the other side of the stack 32 which undergo corresponding selective transmission/reflection, thereby filling in the otherwise spaced radiation profile from the separated emitters 36.

A first set of interleaved beams is passed through a quarter-wave plate 48 to rotate its polarization relative to that of the second set of interleaved beams. Both sets of interleaved beams are input to a polarization multiplexer (PMUX) 52 having a structure of a double polarization beam splitter. Such a PMUX is commercially available from Research Electro Optics. First and second diagonal interface layers 54, 56 cause the two sets of interleaved beams to be reflected along a common axis from their front faces. The first interface 54 is typically implemented as a dielectric interference filter designed as a hard reflector (HR) while the second interface 56 is implemented as a dielectric interference filter designed as a polarization beam splitter (PBS) at the laser wavelength. As a result, the first set of interleaved beams reflected from the first interface layer 54 strikes the back of the second interface layer 56. Because of the polarization rotation introduced by the quarter-wave plate 48, the first set of interleaved beams passes through the second interface layer 56. The intensity of a source beam 58 output by the PMUX 52 is doubled from that of the either of the two sets of interleaved beams.

Although shown separated in the drawings, the interleaver 42, the quarter-wave plate 48, and the PMUX 52 and its interfaces 54, 56, as well as additional filters that may be attached to input and output faces are typically joined together by a plastic encapsulant, such as a UV curable epoxy, to provide a rigid optical system. An important interface is the plastic bonding of the lenslets 40 to the laser stacks 32, on which they must be aligned to the bars 34. The source beam 58 is passed through a set of cylindrical lenses 62, 64, 66 to focus the source beam 58 along the slow axis.

Figure 5:
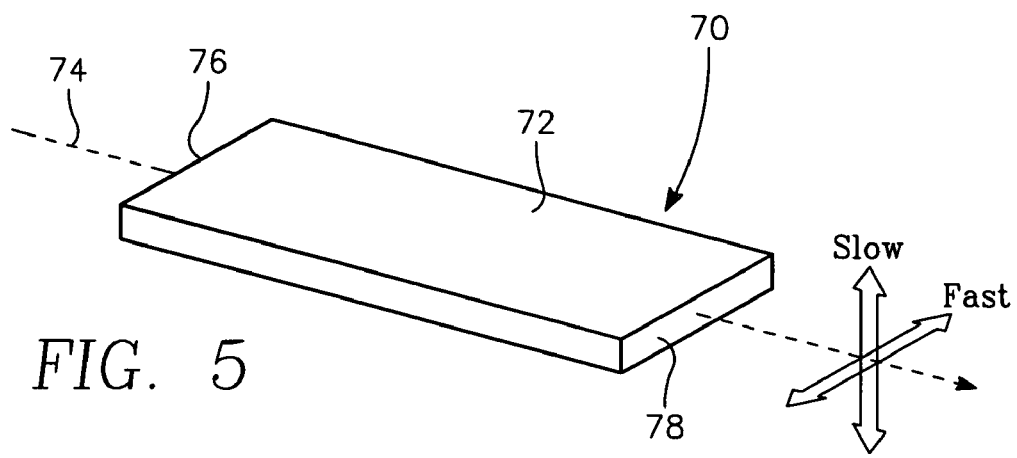
FIG. 5 is an orthographic view of a homogenizing light pipe for the apparatus of FIG. 1.

A one-dimensional light pipe 70 homogenizes the source beam along the slow axis. The source beam, focused by the cylindrical lenses 62, 64, 66, enters the light pipe 70 with a finite convergence angle along the slow axis but substantially collimated along the fast axis. The light pipe 70, more clearly illustrated in the orthographic view of FIG. 5, acts as a beam homogenizer to reduce the beam structure along the slow axis introduced by the multiple emitters 36 in the bar stack 32 spaced apart on the slow axis. The light pipe 70 may be implemented as a rectangular slab 72 of optical glass having a sufficiently high index of refraction to produce total internal reflection. It has a short dimension along the slow axis and a longer dimension along the fast axis. The slab 72 extends a substantial distance along an axis 74 of the source beam 58 converging along the slow axis on an input face 76. The source beam 58 is internally reflected several times from the top and bottom surfaces of the slab 72, thereby removing much of the texturing along the slow axis and homogenizing the beam along the slow axis when it exits on an output face 78. The source beam 58, however, is already well collimated along the fast axis (by the cylindrical lensets 40) and the slab 72 is wide enough that the source beam 58 is not internally reflected on the side surfaces of the slab 72 but maintains its collimation along the fast axis. The light pipe 70 may be tapered along its axial direction to control the entrance and exit apertures and beam convergence and divergence. The one-dimensional light pipe can alternatively be implemented as two parallel reflective surfaces corresponding generally to the upper and lower faces of the slab 72 with the source beam passing between them.

Figure 6:
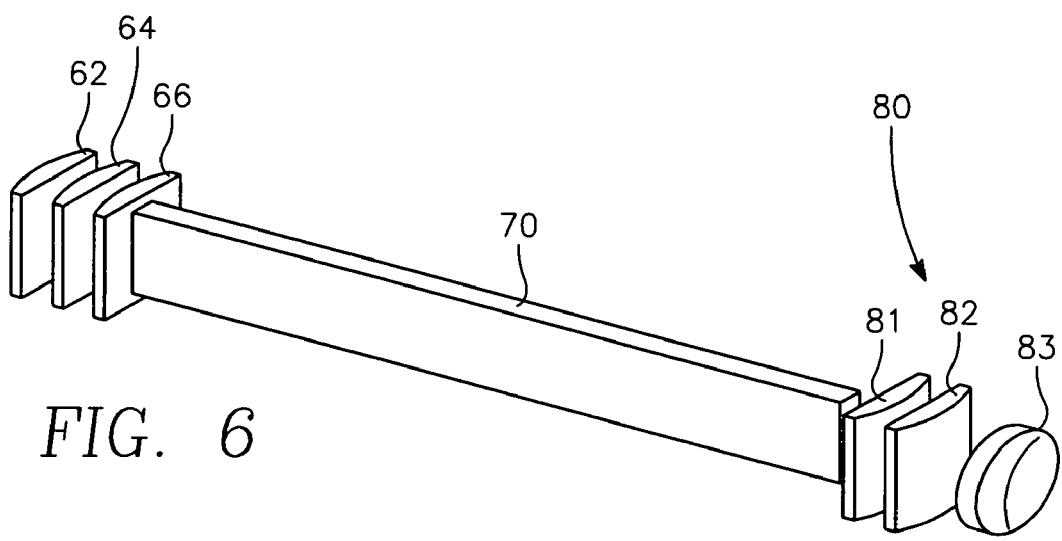
FIG. 6 is a perspective view of the light pipe of FIG. 5 and of the lens assemblies at its input and output faces.

The source beam output by the light pipe 70 is generally uniform. As further illustrated in the schematic view of FIG. 6, further anamorphic lens set or optics 80 including cylindrical lenses 81, 82 expands the output beam in the slow axis and further includes a generally spherical lens 83 to project the desired line beam 26 on the wafer 22. The anamorphic optics 80 shape the source beam in two dimensions to produce a narrow line beam of limited length. In the direction of the fast axis, the output optics have an infinite conjugate for the source at the output of the light pipe (although systems may be designed with a finite source conjugate) and a finite conjugate at the image plane of the wafer 22 while, in the direction of the slow axis, the output optics has a finite conjugate at the source at the output of the light pipe 70 and a finite conjugate at the image plane. Further, in the direction of the slow axis, the nonuniform radiation from the multiple laser diodes of the laser bars is homogenized by the light pipe 70. The ability of the light pipe 70 to homogenize strongly depends on the number of times the light is reflected traversing the light pipe 70. This number is determined by the length of the light pipe 70, the direction of the taper if any, the size of the entrance and exit apertures as well as the launch angle into the light pipe 70. The optics 80 focus the source beam into the line beam of desired dimensions on the surface of the wafer 22.

Figure 7:
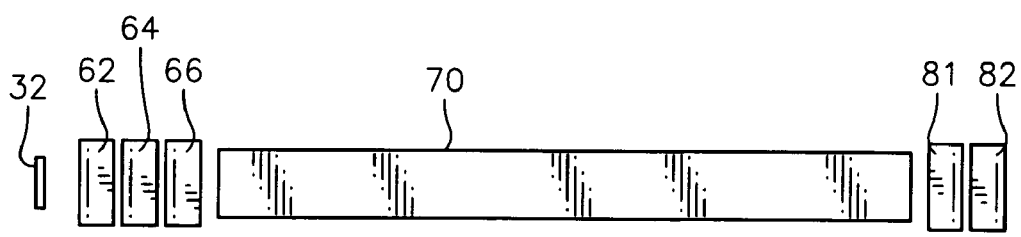
FIG. 7 is a top view of the light pipe of FIG. 6 along the fast axis.
Figure 8:
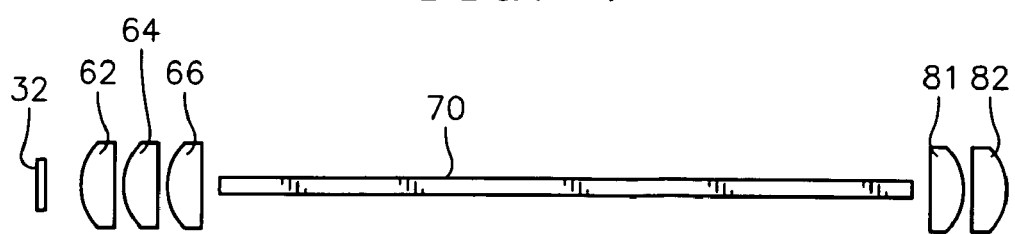
FIG. 8 is a side view of the light pipe of FIG. 6 along the slow axis.

FIGS. 7 and 8 are perpendicularly arranged side views along the fast and slow axes respectively showing the light pipe 70 and some associated optics. In the direction of the fast axis, the beam from the lasers bars 32 is well collimated and not affected by the light pipe 70 or anamorphic optics. On the other hand, in the direction of the slow axis, the input anamorphic optics 62, 64, 66 condense and converge the beam into the input end of the light pipe 70. The beam exits the light pipe 70 with substantially uniform intensity along the slow axis but with a substantial divergence. The output anamorphic optics 81, 82 expand and collimate the output beam along the slow axis.

Figure 9:
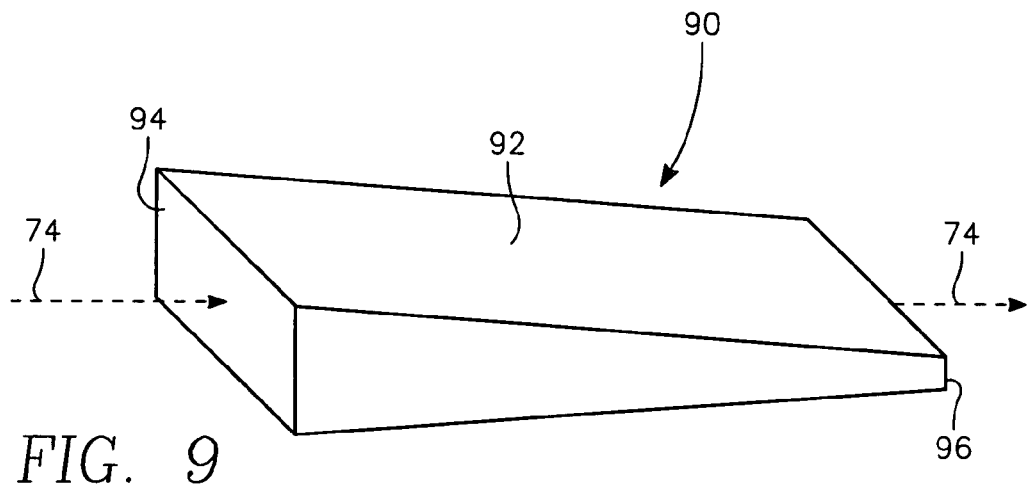
FIG. 9 is an orthographic view of an embodiment of the light pipe of FIG. 5 formed as a truncated wedge having decreasing cross-sectional area along the optical axis.

The light pipe 70 described above has a uniform rectangular cross section along the optical axis 74. However, tapered profiles with cross sections tapering along the optical axis 74 may be advantageously used in combination with the subsequent optics. In particular, a tapered light pipe increases the number of reflections occurring over a fixed length of the light pipe. A dielectric light pipe 90 illustrated orthographically in FIG. 9 is formed from a truncated wedge 92 of optical glass with a uniformly decreasing rectangular cross section along the optical axis 74 from an input face 94 to an output face 96. That is, the aspect ratio of the light pipe 90 is continually increasing, for example, from 5:1 to 10:1, producing a ratio of aspect ratios, for example, of at least 2. In particular, the dimension along the slow axis is decreasing and the dimension along the fast axis may be maintained constant. The advantage of the narrow output face 96 is that its numerical aperture (NA) is higher, that is, the output beam divergence is greater.

Figure 10:
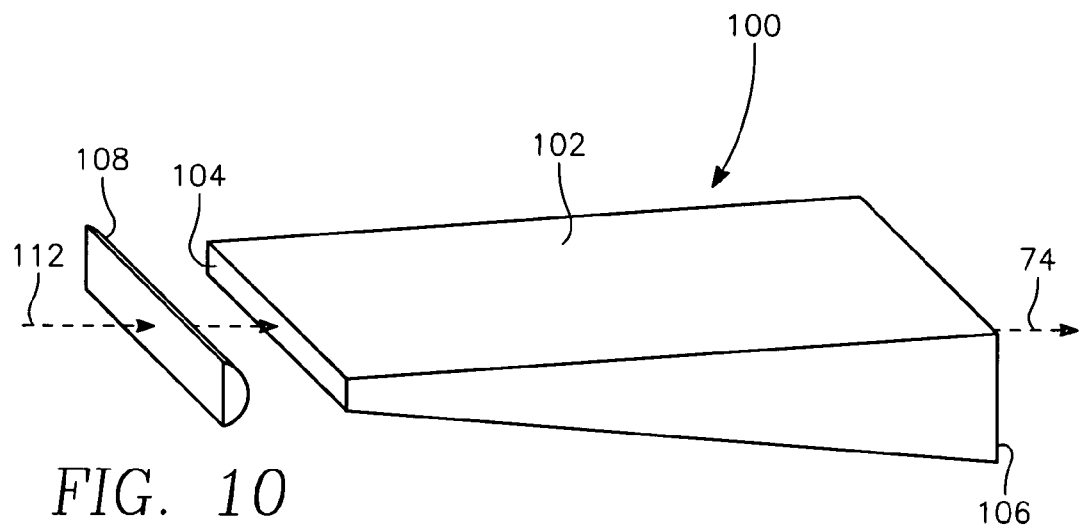
FIG. 10 is an orthographic view of an embodiment of the light pipe of FIG. 5 formed as a truncated wedge having increasing cross-sectional area along the optical axis.
Figure 11:
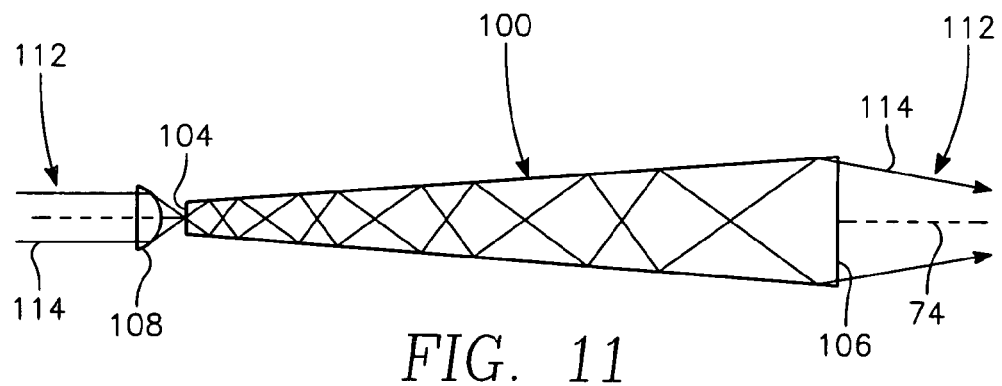
FIG. 11 is diagram of multiple reflections inside the light pipe of FIG. 10, illustrating the effects of a beam diverging lens at the input of the light pipe.

A complementary configuration is a dielectric light pipe 100 illustrated orthographically in FIG. 10 formed of a truncated wedge 102 of optical glass with a uniformly increasing rectangular cross section along the optical axis from an input face 104 to an output face 106 so that the aspect ratio of the wedge 102 is continually decreasing, for example, by ratios reverse to those of the previous embodiment. In particular, the dimension along the slow axis is increasing and the dimension along the fast axis may be maintained constant. This configuration has the advantage that the NA of the wide output face 106 is lower and the output beam divergence is less. Advantageously a cylindrical lens 108 placed near the input face and extending along the long lateral direction of the light pipe 100 focuses a somewhat collimated input beam 112 into a sharply converging beam at the input face 104. As illustrated in the side cross sectional view of FIG. 11, lateral beam components 114 at the ends of the slow direction bounce many times near the small end of the tapered light pipe 100 and are gradually brought closer to be parallel to the optical axis. As a result, the output beam has a small NA and relatively large size along the slow axis.

It is appreciated that the lateral side walls of the dielectric light pipes 70, 90, 100 do not really participate in the action of the light pipe such that a single-axis light pipe is obtained in which no reflecting or homogenizing is obtained in along the long lateral direction of the pipe. Hence, it is not required that those laterals walls be parallel although such parallel walls ease fabrication.

The one-dimensional light pipe can alternatively be implemented as two parallel or slightly inclined reflective surfaces corresponding generally to the upper and lower faces of the slab 72 or wedges 92, 102 with the source beam passing between them. The reflective surfaces can be formed as free-standing mirrors or as coatings on a transparent member not providing total internal reflection.

Post-Ion Implantation Annealing:

The thermal flux laser annealing apparatus and method described above may be used to perform a post-ion implantation anneal of implanted dopant impurities during semiconductor transistor fabrication. A brief description of the transistor fabrication steps performed prior to the post-implant annealing step is now given.

Figure 12:
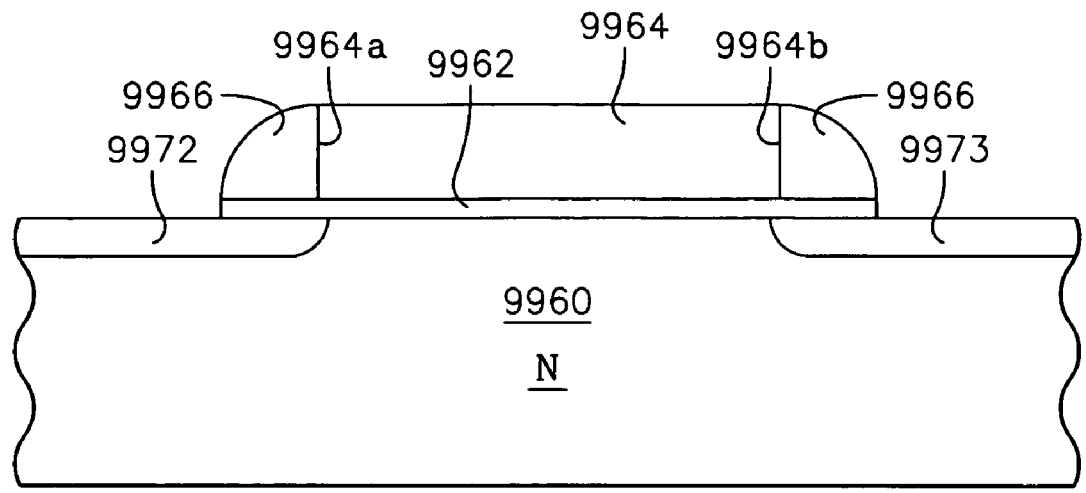
FIG. 12 depicts a first phase in the fabrication of a MOSFET structure by ion implantation.
Figure 13:
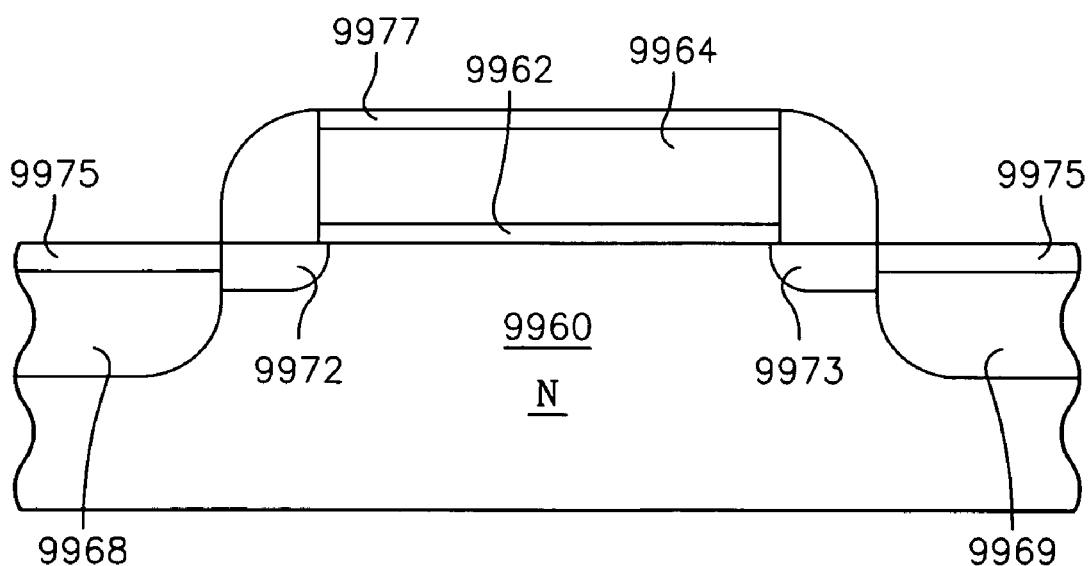
FIG. 13 depicts a later phase in the fabrication of a MOSFET structure by ion implantation.

FIGS. 12 and 13 illustrate different stages in the deposition of dopant impurities in the fabrication of a P-channel metal oxide semiconductor field effect transistor (MOSFET). Referring first to FIG. 12, a region 9960 of a semiconductor (e.g., silicon) wafer may be doped with an N-type conductivity impurity, such as arsenic or phosphorus, the region 9960 being labeled "N" in the drawing of FIG. 12 to denote its conductivity type. A very thin silicon dioxide layer 9962 is deposited on the surface of the wafer including over N-type region 9960. A polycrystalline silicon layer is deposited over the oxide layer 9962 and implanted with a P-type dopant such as boron. This implantation may be carried out by plasma immersion ion implantation or by ion beam implantation. A polysilicon gate 9964 is defined from the blanket polysilicon layer by a conventional etch process. After formation of the gate 9964, a P-type dopant is implanted (by either plasma immersion ion implantation or ion beam implantation) to form source and drain extensions 9972 and 9973. Spacer layers 9966 of a dielectric material such as silicon dioxide and/or silicon nitride (for example) are formed along two opposite vertical sides 9964a, 9964b of the gate 9964. Then, a P-type dopant such as boron is implanted over the entire N-type region 9960 by plasma immersion ion implantation or by ion beam implantation. The spacer layers mask their underlying regions from the implanted species, so that P-type conductivity source and drain contact regions 9968, 9969 are formed on either side of the gate 9964, as shown in FIG. 13. The implantation is carried out for a sufficient time and at a sufficient ion flux or ion density to achieve a surface concentration of boron exceeding $5 \times 10^{15}$ atoms per square centimeter. The concentration of boron in the gate 9964 is then increased to $1 \times 10^{16}$ atoms per square centimeter by masking the source and drain contacts 9968, 9969 (by depositing a layer of photoresist thereover, for example) and carrying out a further (supplementary) implantation step of boron until the concentration of boron in the gate 9964 reaches the desired level ($1 \times 10^{16}$ atoms/cubic centimeter).

Referring now to FIG. 13, source and drain extensions 9972, 9973 are typically formed before depositing and forming the spacer layers 9966 of FIG. 12. The extensions are formed by carrying out a more shallow and light implant of boron over the entire region 9960. Typically, the junction depth of the source and drain extensions is only about 100 to 300 Angstroms and the implant dose is less than $5 \times 10^{15}$ atoms/square centimeter. This implant step, therefore, has little effect on the dopant profiles in the gate 9964 or in the source and drain contacts 9968, 9969, so that these areas need not be masked during the implantation of the source and drain extensions 9972, 9973. A gate metal or silicide layer 9977 and source/drain metal or silicide layers 9975 are formed.

An N-channel MOSFET may be formed by the same steps described above provided the conductivity types of the dopants are reversed from that described above.

Upon completion of the foregoing ion implantation steps, the wafer is annealed using the thermal flux laser anneal apparatus and methods of FIGS. 1–11.

It may be possible to carry out the invention without either the interleaver 42 or the polarization multiplexer 52 or without both of them. While the invention has been described in detail by specific reference to preferred embodiments, it is understood that variations and modifications thereof may be made without departing from the true spirit and scope of the invention.

What is claimed is:

1. A method of forming semiconductor P-N junctions in a substrate, comprising:
    ion implanting dopant impurities into said substrate;
    post-implant annealing said substrate by performing the following steps:
    (a) emitting light from an array of semiconductor laser emitters arranged in plural parallel rows that are parallel to a slow axis;
    (b) making multiple reflections across said slow axis of the light from said laser emitters between a pair of reflective surfaces of a light pipe separated from one another along the direction of said slow axis to produce a light beam homogenized along said slow axis;
    (c) focusing said homogenized light beam onto said substrate as line of light having a broad dimension along said slow axis and a narrow dimension along a fast axis generally perpendicular to said slow axis; and
    (d) scanning said line of light across the substrate in a scanning direction parallel to said fast axis.

2. The method of claim 1, wherein the step of post-implant annealing of said substrate further comprises:
    collimating, along said fast axis, the light from each respective row of laser emitters in respective cylindrical lenses overlying respective ones of said rows of laser emitters.

3. The method of claim 1 wherein the step of post-implant annealing said substrate causes at least a portion of the dopant impurities implanted into said wafer to become substitutional in a crystal lattice of said substrate.

4. The method of claim 1 wherein the step of ion implanting is carried out by plasma immersion ion implantation.

5. The method of claim 1 wherein the step of ion implanting is carried out by ion beam implantation.

6. A method of forming semiconductor P—N junction in a workpiece, comprising:
    ion implanting dopant impurities into said workpiece;
    post-implant annealing said workpiece by performing the following steps:
    (a) emitting light from an array of semiconductor laser emitters arranged along a slow axis;
    (b) making multiple reflections across said slow axis of the light from said laser emitters between a pair of reflective surfaces separated from one another along the direction of said slow axis to produce a light beam homogenized along said slow axis;
    (c) focusing said homogenized light beam onto said workpiece as line of light having a broad dimension along said slow axis and a narrow dimension along a fast axis transverse to said slow axis; and
    (d) scanning said line of light across the workpiece in a scanning direction parallel to said fast axis.

7. The method of claim 1, wherein the step of post-implant annealing of said workpiece further comprises:
    collimating, along said fast axis, the light from said laser emitters.

8. The method of claim 6 wherein the step of post-implant annealing said workpiece causes at least a portion of the dopant impurities implanted into said workpiece to become substitutional in a crystal lattice of said workpiece.

9. The method of claim 6 wherein the step of ion implanting is carried out by plasma immersion ion implantation.

10. The method of claim 6 wherein the step of ion implanting is carried out by ion beam implantation.

* * * * *